US008991036B2

(12) United States Patent
Fath et al.

(10) Patent No.: US 8,991,036 B2
(45) Date of Patent: Mar. 31, 2015

(54) METHOD FOR PRODUCING A GRADIENT COIL ASSEMBLY

(75) Inventors: Sascha Fath, Erlangen (DE); Ralph Kimmlingen, Zirndorf (DE); Johann Schuster, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 100 days.

(21) Appl. No.: 13/525,177

(22) Filed: Jun. 15, 2012

(65) Prior Publication Data

US 2012/0317795 A1 Dec. 20, 2012

(30) Foreign Application Priority Data

Jun. 17, 2011 (DE) ......................... 10 2011 077 743

(51) Int. Cl.

*H01F 7/06* (2006.01)
*G01R 33/385* (2006.01)
*G01R 33/3875* (2006.01)
*G01R 33/421* (2006.01)

(52) U.S. Cl.

CPC ........ *G01R 33/3858* (2013.01); *G01R 33/3875* (2013.01); *G01R 33/4215* (2013.01)
USPC ............... 29/605; 29/593; 29/602.1; 324/318

(58) Field of Classification Search

CPC .......... H01F 41/041; G01R 33/3856–33/3858; G01R 33/385; G01R 33/4215; G01R 33/422
USPC ................ 29/593–594, 605, 606, 602.1, 729; 324/307–309, 317–318, 320–322; 336/185, 205
See application file for complete search history.

(56) References Cited

U.S. PATENT DOCUMENTS 4,906,934 A * 3/1990 Haragashira .................. 324/319
5,296,810 A * 3/1994 Morich ......................... 324/318
5,426,845 A * 6/1995 Weideman ................... 29/602.1
5,572,131 A * 11/1996 Rzedzian ...................... 324/318
5,572,132 A * 11/1996 Pulyer et al. .................. 324/318
6,100,692 A * 8/2000 Petropoulos et al. .......... 324/318
6,111,412 A * 8/2000 Boemmel et al. ............. 324/318
8,008,916 B2 8/2011 Riegler et al.
2013/0229182 A1* 9/2013 Denoth et al. ................ 324/319

FOREIGN PATENT DOCUMENTS

DE 19722211 A1 8/1998
FR 2608309 6/1988
WO WO 2007/009956 A1 1/2007

OTHER PUBLICATIONS

German Office Action dated Mar. 19, 2012 for corresponding German Patent Application No. DE 10 2011 077 743.1 with English translation.

* cited by examiner

*Primary Examiner* — Minh Trinh
(74) *Attorney, Agent, or Firm* — Lempia Summerfield Katz LLC

(57) ABSTRACT

A method for producing a gradient coil assembly for a magnetic resonance imaging system includes applying a number of primary gradient coils and a number of secondary gradient coils to a winding mandrel to form the gradient coil assembly. A control coil arrangement is associated with the winding mandrel. During an intermediate check before completion of the gradient coil assembly, at least one coupling inductance value between the control coil arrangement and at least one of the primary gradient coils and/or at least one of the secondary gradient coils is determined. An arrangement of the relevant gradient coils on the winding mandrel is corrected as a function of the at least one coupling inductance value.

12 Claims, 10 Drawing Sheets

METHOD FOR PRODUCING A GRADIENT COIL ASSEMBLY

This application claims the benefit of DE 10 2011 077 743.1, filed on Jun. 17, 2011.

BACKGROUND

The present embodiments relate to a method for producing a gradient coil assembly for a magnetic resonance imaging system.

In a magnetic resonance imaging system, an object to be examined may be exposed with the aid of a basic field magnet magnetic system to a relatively high basic field magnet magnetic field (e.g., 3 or 7 tesla). A magnetic field gradient is also applied with the aid of a gradient system. High frequency excitation signals (HF signals) are emitted via a high frequency transmission system using suitable antenna devices, and the HF signals are intended to tilt the nuclear spin of certain atoms excited by the high frequency field about a defined flip angle with respect to the basic magnetic field. The high frequency excitation and the resulting flip angle distribution may also be referred to as “core magnetization” or “magnetization” below. During relaxation of the nuclear spin high frequency signals, magnetic resonance signals that are received by suitable receiving antennae and are processed further are radiated. The desired image data may be reconstructed from the raw data thus acquired. The high frequency signals may be emitted for nuclear spin magnetization using a “whole body coil” (e.g., a “body coil”). The whole body coil may be constructed in the manner of a hollow cylinder around a patient space of the magnetic resonance imaging system. An object to be examined or a patient is positioned in the hollow cylinder for an examination using a moveable examination table. One construction for this is a birdcage antenna. The birdcage antenna includes a plurality of transmitting rods that are arranged so as to run parallel to a longitudinal axis around the patient space of the magnetic resonance imaging system. At an end face, the antenna rods are annularly capacitively connected to each other, respectively.

The gradient system for producing the magnetic field gradient includes, for example, a hollow cylinder-shaped gradient coil assembly surrounding the whole body coil. The gradient coil assembly includes at least a plurality of primary gradient coils and may also include secondary gradient coils. The primary gradient coils are the coils, with which the desired gradient field is produced in the patient space, while the secondary gradient coils are used to outwardly shield the magnetic field produced by the primary gradient coils (e.g., the secondary gradient coils are shielding coils). A gradient coil assembly may include three primary gradient coils in order to be able to apply a magnetic field gradient in the direction of the x, y axes and z axis (e.g., the longitudinal axis of the patient space) independently of each other. The gradient coil assembly may also include corresponding separate secondary gradient coils for the x, y and z axes, respectively. The gradient coil assembly may include a shim coil assembly with shim coils (e.g., field coils of a higher order), with which the magnetic fields may be readjusted. To produce a gradient coil assembly of this kind, the individual gradient coils and optionally the shim coils are applied one after the other to a winding mandrel in the correct sequence from the inside out and are fixed to each other (e.g., cast). Once the winding mandrel has been removed, the finished gradient coil arrangement may be measured in a field measuring device. The coupling inductance between the individual coils of the various gradient axes and optionally relating to the shim coils is determined in addition to the field characteristic of the gradient coil. Instances with excessive coupling inductance between the individual coils or undesirable field differences may be rejected.

To produce the magnetic resonance imaging system, the finished whole body coil and the finished gradient coil arrangement are arranged such that the finished whole body coil and the finished gradient coil arrangement are pushed into each other in the basic field magnet.

With this construction, the size of the patient space, in which a patient is situated during the examination, is defined by the internal diameter of the whole body coil. The diameter of the patient space may be about 60 cm. The consequence of this is that many patients feel claustrophobic during such examinations. The diameter of the patient space may be increased. To achieve an enlargement, the basic field magnet may be enlarged. This, however, leads to significant cost increases, as the magnetic fields become ever stronger. Alternatively, the components of the magnetic resonance imaging system (e.g., the gradient coil assembly and the whole body coil) arranged in the basic field magnet around the patient space may have dimensions reduced in the radial direction. To increase the patient space from 60 cm to 70 cm, for example, the radial dimensions of the ensemble of the gradient coil assembly and the whole body coil is reduced from a thickness of about 150 mm to about 100 mm. For example, the thickness of the gradient coil assembly is reduced from about 100 mm to 70 mm. The sensitivity of the signal field of the gradient coils to manufacturing variations increases significantly due to this reduction in space, so only a low manufacturing tolerance is acceptable. Consequently a higher reject rate is expected.

SUMMARY AND DESCRIPTION

The present embodiments may obviate one or more of the drawbacks or limitations in the related art. For example, a method and a system for producing gradient coil units and a winding mandrel, with which manufacturing tolerances may be inexpensively kept lower, are provided.

In one embodiment of a method for producing a gradient coil assembly for a magnetic resonance imaging system, a number of primary gradient coils (e.g., three primary gradient coils for the x, y and z axes) and a number of secondary gradient coils are gradually applied to a winding mandrel in individual acts. A shim coil assembly may also be arranged on the winding mandrel in one or more additional intermediate acts (e.g., between the primary gradient coil assembly and the secondary gradient coil assembly). The complete gradient coil assembly is connected to itself (e.g., cast in a synthetic resin of the like) and removed from the winding mandrel for further installation in the tomographs.

According to the present embodiments, however, a winding mandrel is used in this connection, with which a control coil arrangement is associated. During an intermediate check (e.g., in an intermediate measurement) before completion of the gradient coil assembly, the intermediate check is used to determine at least one coupling inductance value between the control coil arrangement and at least one of the primary gradient coils and/or at least one of the secondary gradient coils.

The coupling inductance value is a value that represents the inductive coupling between a gradient coil and a control coil of the control coil arrangement. The inductive coupling may also be referred to as the mutual inductance of the system including gradient coil and control coil. When determining the coupling inductance values, a coupling inductance between the primary and secondary windings is measured, as in the case of a transformer with, for example, the primary and/or secondary gradient coil(s) assuming the role of the "primary winding," and the control coil arrangement assuming the role of the "secondary winding." The control coil arrangement and the primary and/or secondary gradient coil may swap roles (e.g., the control coil arrangement is regarded as the primary winding, while the primary and/or secondary gradient coils constitute the secondary winding).

The size of the coupling inductance value determined between a gradient coil and the control coil arrangement therefore also provides a clue to the coupling inductance relating to other gradient coils or the shim coils and consequently to the quality of the relevant gradient coil. This information may be used to correct the arrangement on the winding mandrel of the gradient coil currently being checked. For example, whether the measured coupling inductance value lies within a certain tolerance range may be checked. If this is not the case, the arrangement of the gradient coil previously arranged on the winding mandrel is changed until the coil does lie in the tolerance range. A correction of the arrangement may be both a change in the construction of the coil (e.g., a shaping of the conductor tracks of the coil) and a physical displacement on the winding mandrel. If the coupling inductance value is within the tolerance range, a correction is not required (any longer), and there is accordingly no change in the arrangement of the gradient coil.

Due to the correction of the arrangement of the gradient coil as a function of the size of the measured coupling inductance value in an intermediate act before the final completion of the gradient coil assembly, improved quality may be provided for as early as during construction, and the rejection rate may be reduced. The overall costs may therefore be reduced despite the low additional expenditure. For example, when producing a patient space with a diameter of 70 cm, a comparable variation in manufacturing to a patient space with a smaller diameter of, for example, just 60 cm may thus be achieved.

The control coil arrangement may include one control coil. In one embodiment, the control coil arrangement includes a plurality of control coils to thus determine coupling inductance values in relation to each of the control coils of the control coil arrangement and therefore for various geometries or spatial directions. The method may be carried out, for example, such that in an intermediate act, various coupling inductance values are separately considered for the individual control coils of the control coil arrangement. Therefore, long corrections take place until all coupling inductance values lie in the tolerance range. The coupling inductance values of the individual control coils may, however, also be combined to form a common coupling inductance value that may lie within certain tolerances.

In one embodiment, a winding mandrel for producing a gradient coil assembly for a magnetic resonance imaging system includes a control coil arrangement associated with the winding mandrel for determining a coupling inductance between the control coil arrangement and a primary gradient coil and/or a secondary gradient coil of the gradient coil assembly.

The present embodiments also include a system for producing a gradient coil assembly for a magnetic resonance imaging system. The system includes, in addition to one embodiment of a winding mandrel having a control coil arrangement associated with the winding mandrel, a measuring device for determining a coupling inductance value between the control coil arrangement and at least one primary gradient coil and/or secondary gradient coil arranged on the winding mandrel during construction of the gradient coil assembly. At least one part of the measuring device is connected to the control coil arrangement at least during operation of the measuring device.

The claims of one category may also be developed analogously to the claims of another claims category.

The control coil arrangement may include, as control coils, field coils with a magnetic field geometry of a higher order (e.g., field coils), with which a magnetic field with an order of more than the first order (e.g., field gradient) may be produced. In one embodiment, shim coils, as are also used inside the gradient coil assembly, may be used as control coils (e.g., in the form of shim coil printed circuit boards). As mentioned above, the control coil arrangement may include a plurality of control coils. The plurality of control coils may include at least five control coils (e.g., exactly five control coils). The plurality of control coils may be configured such that field geometries of the plurality of control coils match the field terms of a spherical harmonics development of the second order (e.g., the $A_{21}$ term, $B_{21}$ term, $A_{22}$ term, $B_{22}$ term and $A_{20}$ term). Linear cross eddy terms $A_{11}$ and $B_{11}$ may thereby be measured in addition to the field terms of the second order.

The control coil arrangement associated with the winding mandrel may be constructed separately from the winding mandrel. The control coil arrangement, for the construction of the gradient coil assembly, may, for example, be introduced into the interior of a hollow winding mandrel and be fixed in the interior of the hollow winding mandrel if required without there being a permanent structural connection between the winding mandrel and the control coil arrangement. The control coil arrangement is, for example, only temporarily integrated in the winding mandrel and may be inserted successively in different winding mandrels.

In one embodiment, the control coil arrangement is permanently integrated in the winding mandrel (e.g., is a permanent component of the winding mandrel). This makes readjustment of the control coil arrangement superfluous when used in the winding mandrel.

A winding mandrel that is manufactured from an electrically non-conductive material and/or a material with low electrical conductivity (e.g., with a conductivity of less than $2 \cdot 10^6$ S/m) may be used for one embodiment of the method. Suitable materials of this kind for producing a winding mandrel are glass fiber-reinforced plastic or stainless steel. The formation of eddy currents in the winding mandrel, which may affect determination of the coupling inductance value, is reduced by use of non-conductive or only weakly conductive material of this kind, so the accuracy of the method is increased. Use of a winding mandrel of this kind is also advantageous for a conventional check measurement only after complete construction of the gradient coil assembly, if the gradient coil assembly is still located on the winding mandrel (e.g., when curing the casting material).

For permanent integration of the control coil arrangement in the winding mandrel, the arrangement may, by way of example, be applied to the outside of the winding mandrel or, in the case of a hollow winding mandrel, to the inside. The control coils may be glued, for example, to the winding mandrel or secured in some other way to the wall of the winding mandrel. The winding mandrel may include recesses (e.g., grooves or the like) on the outside and/or an inner side of the winding mandrel. The control coils of the control coil arrangement are introduced into the recesses. The recesses may be milled or cut into a wall of the winding mandrel for this purpose. In order to obtain a sufficiently smooth surface for the application of the gradient coils (e.g., when the control coil arrangement is provided in the outside of the winding mandrel), the recesses may be cast with a material (e.g., casting resin or another plastics material). Integration of the control coil arrangement in or on the outside of the winding mandrel has the advantage that the control coils are arranged as close as possible to the gradient coil assembly constructed on the winding mandrel.

As described above, a measuring device connected to the control coil arrangement during operation is used for determining a coupling inductance value. In one embodiment, the measuring device includes a test signal generator in addition to the actual measuring circuit. A test signal is fed by the test signal generator into the gradient coil to be checked, and the voltage induced by the gradient coil in the control coils is measured by the measuring circuit connected to the control coil arrangement. The voltage is representative of the inductive coupling between the gradient coil to be checked and the control coil and may, as described below, be converted, for example, into a coupling inductance value. Alternatively, a test signal may conversely also be fed into the control coil arrangement or a control coil by the test signal generator, and the voltage induced in the gradient coil may be measured by the measuring circuit connected to the gradient coil to be checked.

A low-frequency test signal (e.g., with substantially constant maximum amplitude or in the form of a sweep signal with defined bandwidth) may be used. A low-frequency test signal may be an electrical signal having a frequency that lies in a range between 10 Hz and 300 Hz. A test signal with a frequency of between 20 and 50 Hz may be used (e.g., 30 Hz). The test signal generator may include a regulated power source, for example, for this purpose. A sinusoidal electrical current of the desired frequency may be fed either into the control coil arrangement or the gradient coil to be checked with the regulated power source. Undesirable variations in current amplitude, which are caused, for example, by the temperature-dependent ohmic resistance of the coils and may falsify the measuring result, may be largely ruled out by using a regulated power source.

The measuring circuit may include a low-pass filter with a limiting frequency above the frequency of the test signal for determining the coupling inductance value. The low-pass filter filters out high frequency interference signals that couple into the coils, and therefore helps to increase the measuring accuracy.

The test signal generator may be constructed so as to be integrated in a structural assembly (e.g., in a housing). The measuring circuit may form the measuring device. The test signal generator may, however, also be constructed separately from the measuring circuit.

In one embodiment, at least one coupling inductance value is compared with at least one coupling inductance limit value for checking purposes. The arrangement of the primary gradient coil and/or the secondary gradient coil is changed if a coupling inductance value exceeds the coupling inductance limit value (or, depending on the type of coupling inductance value, the coupling inductance limit values) or if a coupling inductance value falls below the coupling inductance limit value. One coupling inductance limit value may be provided. In one embodiment, a large number of coupling inductance limit values (e.g., for each primary and secondary gradient coil) for the x, y and z axes may be provided. The coupling inductance limit value may be a value or a value interval with fixed limits, within which an arrangement of a gradient coil is located within manufacturing tolerance.

In addition to the measuring device, the system for construction of the gradient coil assembly may include a comparator that takes the measured value and compares a determined coupling inductance value with one or more coupling inductance limit value(s) to thus establish whether the gradient coil to be checked lies within the manufacturing tolerances.

An evaluation assembly and an output assembly may also be associated with the system. The evaluation assembly and the output assembly evaluate and output the result of the comparison carried out by the comparator. The evaluation assembly and the output assembly are configured, for example, so that measured values (e.g., a plurality of measured values) that have been obtained with a plurality of control coils of the control coil arrangement are evaluated. The measured values are evaluated such that when one or more limit value(s) are exceeded, an operator is simultaneously provided with information on how the arrangement of the gradient coil currently being checked is to be changed for the coupling inductance limit value to be maintained.

The process of producing the gradient coil assembly includes successively applying, in individual acts, the primary gradient coils for the x, y and z axes, and subsequently applying the secondary gradient coils for the x, y and z axes. A shim coil assembly having individual shim coils may be applied between the application of the primary gradient coil assembly and the secondary gradient coil assembly.

Furthermore, cooling tubes or cooling hoses may also be arranged between the individual units or coils K, and the cooling tubes or cooling hoses may be applied in corresponding intermediate acts.

The intermediate checks are carried out during construction between the acts of applying the individual gradient coils. The acts for applying a gradient coil and the intermediate checks may alternate, respectively. The coupling inductance value of at least the gradient coil applied last during the production method is determined in an intermediate check, since the construction and position thereof may still be changed before a further outer gradient coil is applied to the gradient coil, which is currently to be checked in a further act.

A circumferential and/or axial position of the relevant gradient coil may be changed, for example, in the case of a construction of gradient coils in the form of saddle coils if, for example, the determined coupling inductance limit value is not maintained. Other suitable forms of coils may also be chosen instead of saddle coils (e.g., a helical coil that is wound onto the winding core). Alternatively, the applied gradient coil may also be removed completely and re-positioned in order to change the circumferential and/or axial position of the relevant gradient coil. After changing the arrangement of the relevant gradient coil, the coupling inductance may be re-determined in order to check the gradient coil. This gradient coil may be fixed, for example, with a casting compound for subsequent casting.

One of the primary gradient coils may be applied to the winding mandrel to form the gradient coil assembly. This may be the gradient coil for the x, y or z axes. Before a further gradient coil of the primary gradient coils is accordingly applied to the winding mandrel, a coupling inductance value is determined between the control coil arrangement and the primary gradient coil in a subsequent intermediate check. The arrangement of the primary gradient coil is corrected as a function of the first coupling inductance value. A first coupling inductance value is, in this connection, a value that represents the inductive coupling between one of the primary gradient coils or the complete assembly of the primary gradient coil arrangement and the control coil arrangement.

All primary gradient coils for the x, y and z axes, for example, may be applied one after the other, and the respective first coupling inductance value of the primary gradient coil applied last is determined. Optionally, the arrangement of the relevant primary gradient coil is corrected in an intermediate check. If the control coil arrangement includes, for example, five control coils, five measurements in total may be carried out in each intermediate check for the current gradient coil. A total of 15 first coupling inductance values, which may optionally be compared with 15 coupling inductance limit values, therefore result for the three primary gradient coils for the x, y and z axes. The construction of the complete primary gradient coil assembly may be checked and optionally corrected at once in a combined intermediate check.

Following application of the primary gradient coil, a shim coil assembly with, for example, five shim coils that, during subsequent operation of the magnetic resonance imaging system, may be used for correction of the magnetic fields, may be applied. The construction and position of each individual shim coil of the shim coil assembly or the entire shim coil assembly as a unit may, as described above, be checked and optionally corrected by determining at least one of the coupling inductance values using the control coil arrangement.

In a further act, one of the secondary gradient coils may be applied to the winding mandrel to form the gradient coil assembly, or all secondary gradient coils for the x, y and z axes may be applied to the winding mandrel in acts one after the other. Following application of each individual secondary gradient coil, a second coupling inductance value between the control coil arrangement and the secondary gradient coil may be determined in a subsequent intermediate check. The current gradient coil may optionally be corrected, or the complete secondary gradient coil assembly is jointly checked and optionally corrected in a subsequent intermediate check. A second coupling inductance value is accordingly a value that represents the inductive coupling between one of the secondary gradient coils or the complete arrangement of the secondary gradient coil assembly and the control coil arrangement. If the control coil arrangement includes five control coils, a total of 15 coupling inductance values may also be determined and be compared with 15 second coupling inductance limit values when checking the secondary gradient coils.

In one embodiment, when determining a second coupling inductance value between the control coil arrangement and a secondary gradient coil, the primary gradient coil is connected so as to be free floating. "Connected so as to be free floating" may be that the terminals of the primary gradient coils are open (e.g., do not have an electrically conductive connection to a specific electrical potential). When determining the second coupling inductance value, the ohmic resistance in the primary gradient coil is maintained, and no electrical currents that would falsify the result of the measurement of the coupling inductance value between the control coil arrangement and the secondary gradient coil may be induced in the primary gradient coils. The shim coils of the shim coil assembly may also be connected so as to be free floating.

In one embodiment of the method, at least one of the primary gradient coils and at least one of the secondary gradient coils are connected in series, and a "total coupling inductance value" between the control coil arrangement and the primary and secondary gradient coils connected in series is measured. The series connection of the primary and secondary gradient coils may be such that a direction of winding in the primary gradient coil is opposed to a direction of winding of the secondary gradient coil. A series connection with identical directions of winding of the primary and secondary gradient coils may also be used. The arrangement of the primary gradient coil and/or the secondary gradient coil may be corrected as a function of the total coupling inductance value. The primary gradient coils in the x, y and z directions respectively are connected in series with the associated secondary gradient coil for the x, y and z axes, as may also be the case in the finished magnetic resonance imaging system. Further coupling inductance values, in which gradient coils for different axes are combined with each other (e.g., the primary gradient coil for the x axis with the secondary gradient coil for the y axis), may also be determined. Coupling inductance values may also be determined with a parallel connection of primary and secondary gradient coils.

A total coupling inductance value may be determined as soon as at least one of the secondary gradient coils has been applied to the winding core (e.g., once the first and second coupling inductance values have been determined). A total coupling inductance value may also be determined before a second coupling inductance value. If a control coil arrangement with five control coils is used, five coupling inductance values may be determined for each series circuit combination including primary and secondary gradient coils for the respective x, y and z axes, and be compared with 15 coupling inductance limit values.

Alternatively, the total coupling inductance value may also be determined without the first coupling inductance value and the second coupling inductance value having been measured in advance. In other words, in this embodiment of the method, only the total coupling inductance value is determined. Therefore, the time required for the intermediate checks is significantly reduced. This measurement also takes place before the ultimate completion of the gradient coil assembly, so another correction of the arrangement of the gradient coils is possible.

To be able to carry out measurement of the coupling inductances during the intermediate checks economically in terms of time, the system may include a switching device to switch the measuring device (e.g., the test signal generator and/or the measuring circuit) in an appropriately synchronized manner respectively to the various coils of the control coil arrangement, the gradient coil assembly, or the shim coil assembly.

DETAILED DESCRIPTION OF THE DRAWINGS

Figure 1:
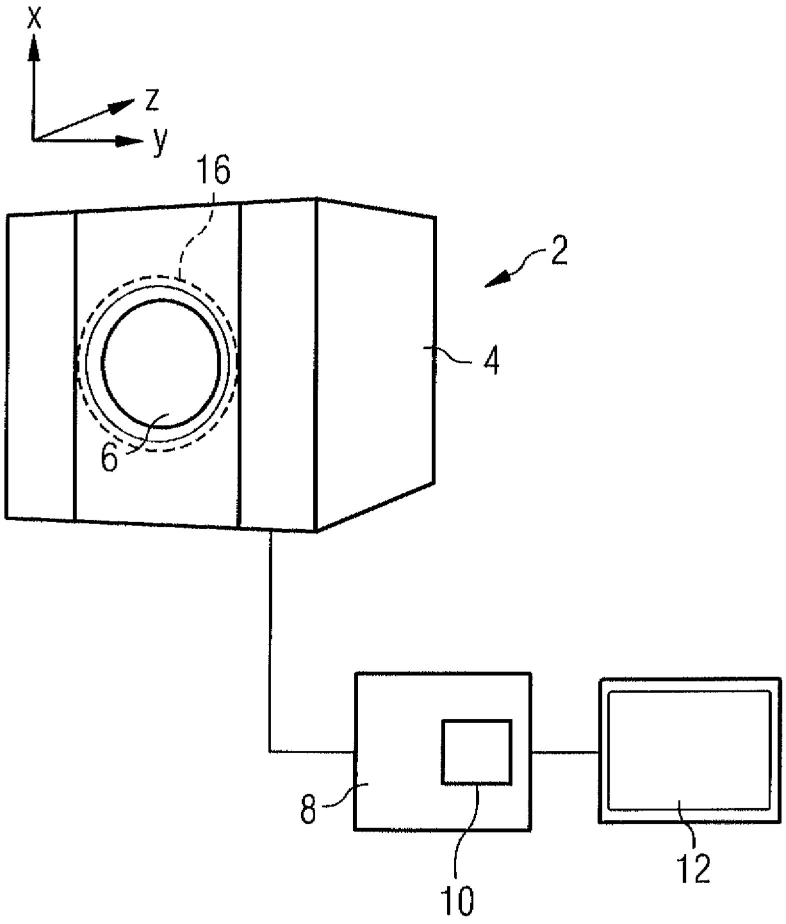
FIG. 1 shows a schematic view of one embodiment of a magnetic resonance imaging system.

FIG. 1 shows a schematic view a magnetic resonance imaging system 2 that includes a scanner 4 having a patient space 6 in the form of a patient tunnel 6 (e.g., with a diameter of 70 cm), in which a patient is positioned for the performance of a magnetic resonance examination. A gradient coil assembly 16 that is connected to a controller 8 to produce a gradient magnetic field that may be used in a known manner for spatial resolution of the received magnetic resonance signals during performance of a magnetic resonance examination may be arranged in the scanner 4. The controller 8 includes a large number of additional components (not shown) that are used to control a wide variety of systems within the scanner 4. The controller 8 also includes, for example, an image reconstruction device 10 that produces magnetic resonance images on the basis of the received magnetic resonance signals. The magnetic resonance images may be output, for example, on a monitor 12. The basic construction, function and mode of operation of such a magnetic resonance imaging system 2 are sufficiently known to a person skilled in the art, however, and do not require any further explanation.

Figure 2:
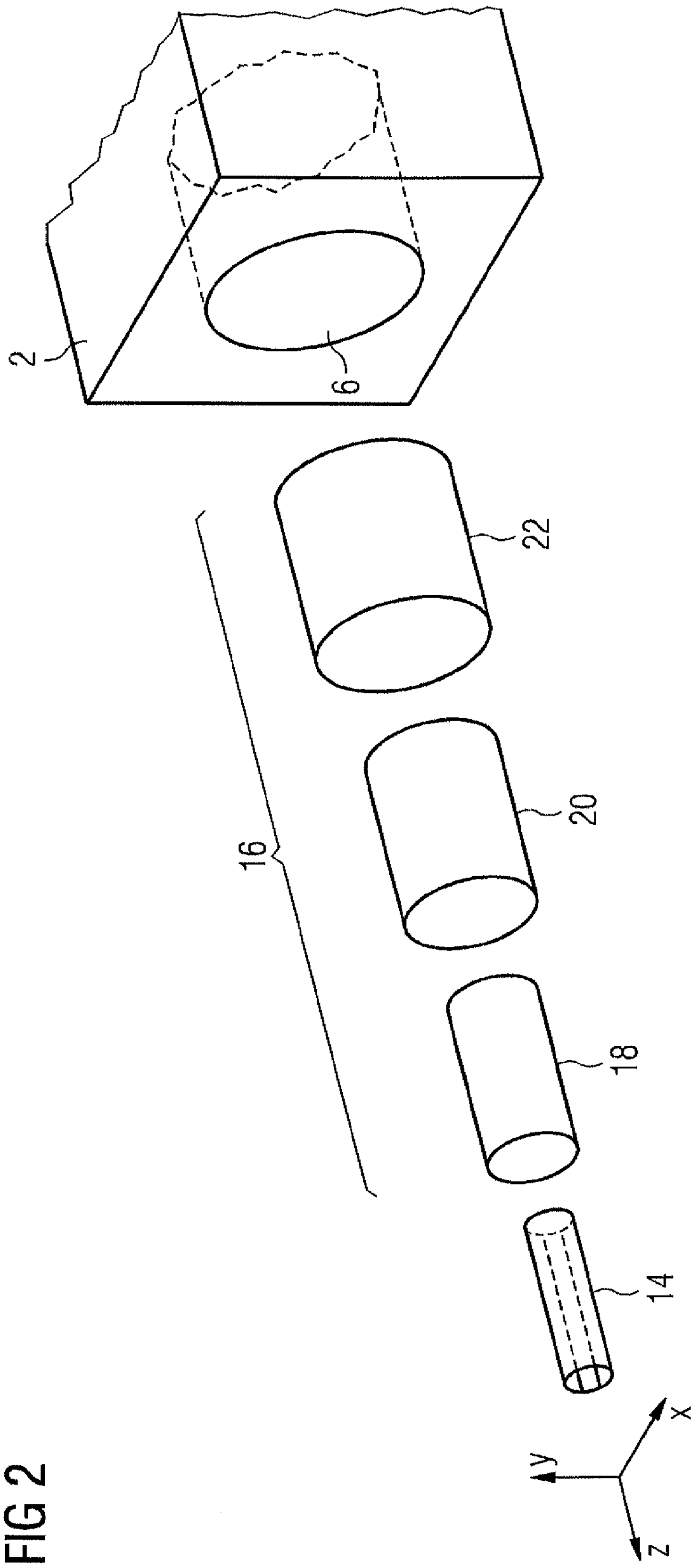
FIG. 2 shows an exploded view of an example patient tunnel of a magnetic resonance imaging system.

FIG. 2 shows, in an exploded view, a construction of one embodiment of a gradient coil assembly 16. The exploded view in FIG. 2 does not indicate an assembly direction of the individual components of the gradient coil assembly 16. The gradient coil assembly 16 has the form of a hollow cylinder, for example. A high frequency antenna 14 (e.g., the whole body coil) is inserted inside the finished gradient coil assembly 16 during final arrangement. During operation of the magnetic resonance imaging system 2, the high frequency antenna 14 is used in a known manner for sending and receiving high frequency signals for performing a magnetic resonance examination. The finished gradient coil assembly 16 is inserted in the scanner 4.

The gradient coil assembly 16 may include a primary gradient coil assembly 18, a shim coil assembly 20 and a secondary gradient coil assembly 22.

The construction of such a gradient coil assembly 16 takes place with the aid of a winding mandrel 44, on which the individual coils are gradually applied and cast to form a composite.

Figure 4:
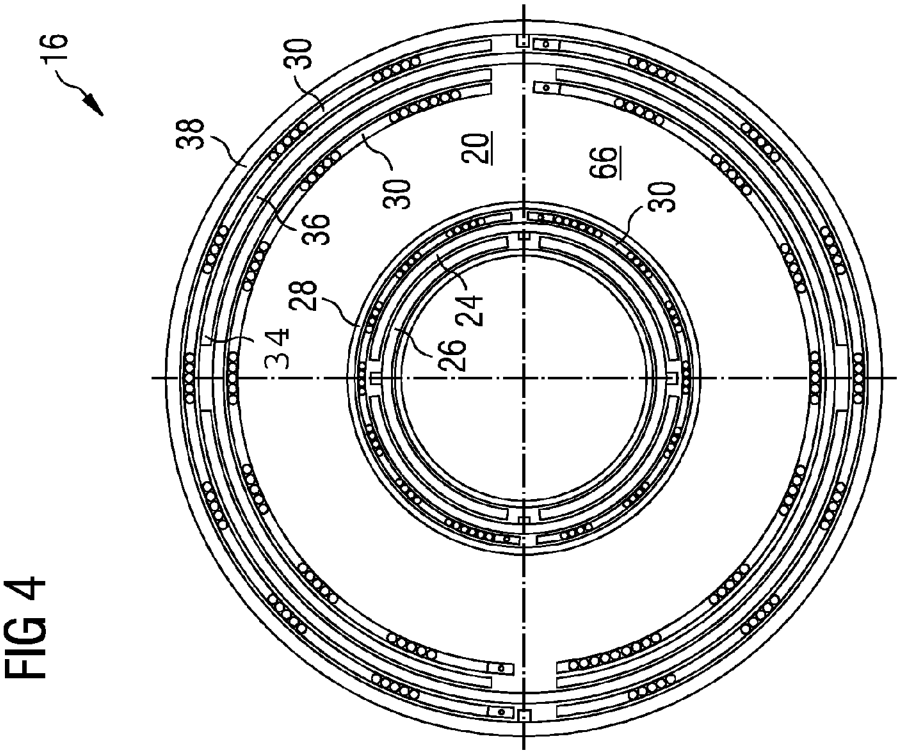
FIG. 4 shows a cross-sectional view of one embodiment of the winding mandrel according to FIG. 3.
Figure 3:
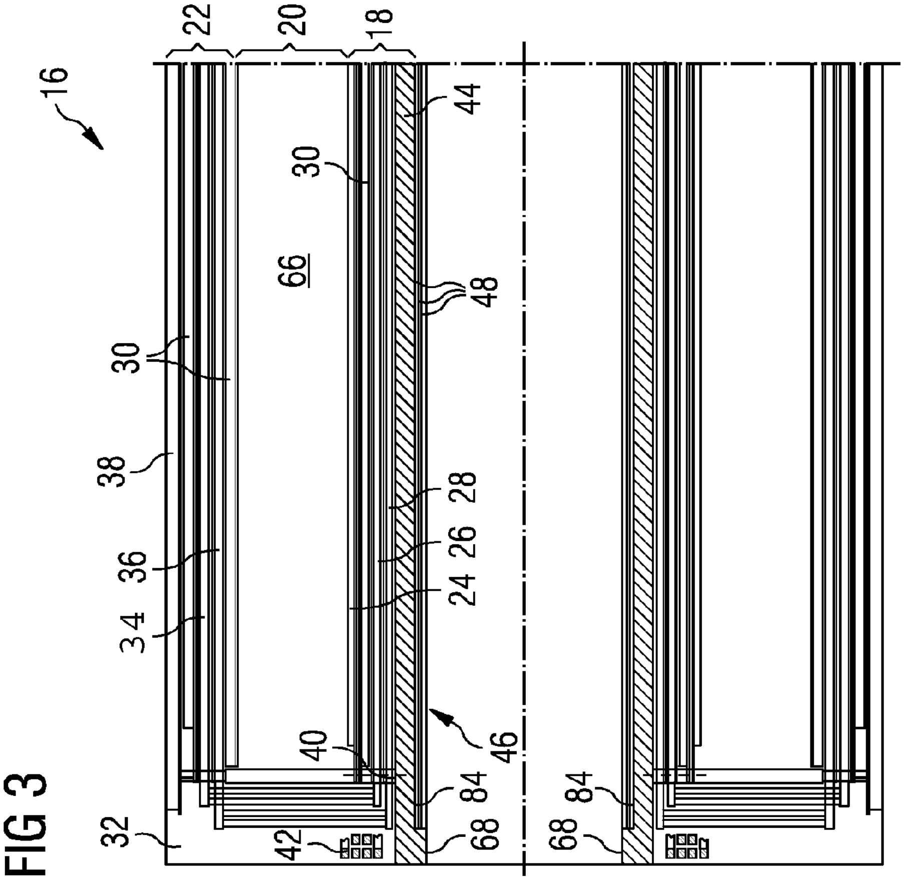
FIG. 3 shows a longitudinal section through one embodiment of a winding mandrel with a gradient coil assembly constructed on the winding mandrel.

FIGS. 3 and 4 show a first exemplary embodiment of a winding mandrel 44 suitable for this purpose and to which a gradient coil assembly 16 has been applied.

A primary y gradient coil 26, on which a primary x gradient coil 24 is applied as the second primary gradient coil, is located directly on the winding mandrel 44, for example, as a first coil of a primary gradient axis assembly 18. The primary gradient axis assembly 18 is completed by the primary z gradient coil 28. Cooling tubes 30 are introduced between the primary x gradient coil 24 and the primary z gradient coil 28. The cooling tubes 30 are used for cooling the gradient coil assembly 16 during operation.

The primary gradient axis assembly 18 is used to produce the desired magnetic field gradient. The primary x gradient coil 24 is used in this connection to produce a magnetic field gradient along the x axis, the y gradient coil 26 is used to produce a magnetic field gradient along the y axis, and the z gradient coil 28 is used to produce a magnetic field gradient along the z axis. The x gradient coil 24 and the y gradient coil 26 are configured as saddle coils, while the primary z gradient coil 28 is configured in the form of coils that annularly surround the patient space 6.

The shim coil assembly 20 is applied to the primary gradient axis assembly 18. The shim coil assembly 20 is used to compensate inhomogeneities in the magnetic field produced, for example, by the gradient coils. The shim coil assembly 20 includes five shim coils 66 (not shown in detail), for example, with field geometries matching the five field terms of a spherical harmonics development of the second order. One example for the construction of such coils may be found, for example, in WO 2007/009956 and U.S. Pat. No. 8,008,916, which are hereby incorporated by reference.

A secondary y gradient coil 36 is applied to the shim coil assembly 20 as a first coil of the secondary gradient axis assembly 22, followed by a secondary x gradient coil 34. The secondary gradient axis assembly 22 is completed by a secondary z gradient coil 38. Cooling tubes 30 are again arranged between the shim coil assembly 20 and the secondary gradient axis assembly 22. Cooling tubes 30 are also arranged between the secondary z gradient coil 38 and the secondary y gradient coil 36.

The secondary gradient coil assembly 22 is used to neutralize the magnetic field produced by one of the primary gradient coils 24, 26, 28 of the primary gradient coil assembly 18 in regions outside of the gradient coil assembly 16 in order not to disrupt other components of the magnetic resonance imaging system 2 in the interior of the scanner 4. For this purpose, the secondary x gradient coil 34 is again used to produce a magnetic field gradient along the x axis, the y gradient coil 36 is used to produce a magnetic field gradient along the y axis, and the z gradient coil 38 is used to produce a magnetic field gradient along the z axis. The primary gradient coils 24, 26, 28 and the secondary gradient coils 34, 36, 38 for the x, y and z axes are each interconnected in series to each other so as to be antiparallel in terms of direction of winding, so electric current with an opposing direction flows through the primary gradient coils 24, 26, 28 and secondary gradient coils 34, 36, 38. As a consequence, the magnetic fields produced by the primary gradient coils 24, 26, 28 are attenuated by the magnetic fields produced by the secondary gradient coils 34, 36, 38. The secondary x gradient coil 34, the secondary y gradient coil 36, and the secondary z gradient coil 38 have, in comparison to the primary gradient coils 24, 26, 28, for example, a lower number of windings. Therefore, the secondary x gradient coil 34, the secondary y gradient coil 36, and the secondary z gradient coil 38 produce weaker magnetic fields having a strength that is, for example, only half that of the magnetic fields that are produced by the primary gradient coils 24, 26, 28. The secondary x gradient coil 34, the secondary y gradient coil 36, and the secondary z gradient coil 38 may be constructed so as to be similar to the primary gradient coils 24, 26, 28.

Interconnect rings 42 that are used for electrical contacting of the individual gradient coils 24, 26, 28, 34, 36, 38 are located on one end face of the gradient coil assembly 16 (see FIG. 3). The entire gradient coil assembly 16 is cast with a casting compound 32 for completion. The casting compound 32 encloses the interconnect rings 42 and the individual gradient coils 24, 26, 28, 34, 36, 38.

When the gradient coil assembly 16 is finished, and the casting compound 32 has cured, the assembly is removed from the winding mandrel 44 and may be put in the scanner 4 if the manufacturing tolerances were adhered to when producing the gradient coil assembly 16. The winding mandrel 44 may be configured for this purpose such that the winding mandrel 44 tapers slightly conically in one direction along an axis of symmetry (not shown). This facilitates detachment of the cast gradient coil assembly 16 from the winding mandrel 44 by removal in the direction of the axis of symmetry. A suitable separating layer may also be applied to the outside of the winding mandrel 44 before the first coil is applied.

The winding mandrel 44 also includes adjusting pins 40 to align the individual gradient coils of the gradient coil assembly 16 during assembly.

The winding mandrel 44 has the form of a hollow cylinder, for example and on an inner side 68, has one or more recesses 84, in which one embodiment of a control coil arrangement 46 is arranged. In the exemplary embodiment, the control coil arrangement 46 includes five control coils 48 (of which three are shown). The control coils 48 may be constructed so as to be identical to the shim coils 66 of the shim coil assembly 20. Conventional (e.g., flexible) shim coil printed circuit boards may also be used as control coils since such shim coil printed circuit boards are also constructed very precisely. According to the present embodiments, in intermediate checks, coupling inductance values may be determined using these control coils 48 during construction.

In order not to falsify the measuring results, the winding mandrel 44 is manufactured, for example, from a material having low electrical conductivity below $2 \cdot 10^6$ S/m (e.g., from glass fiber-reinforced plastic or stainless steel). The cooling tubes 30 in the gradient coil assembly 16 may, for example, be manufactured from a material with low or even no electrical conductivity.

Figure 5:
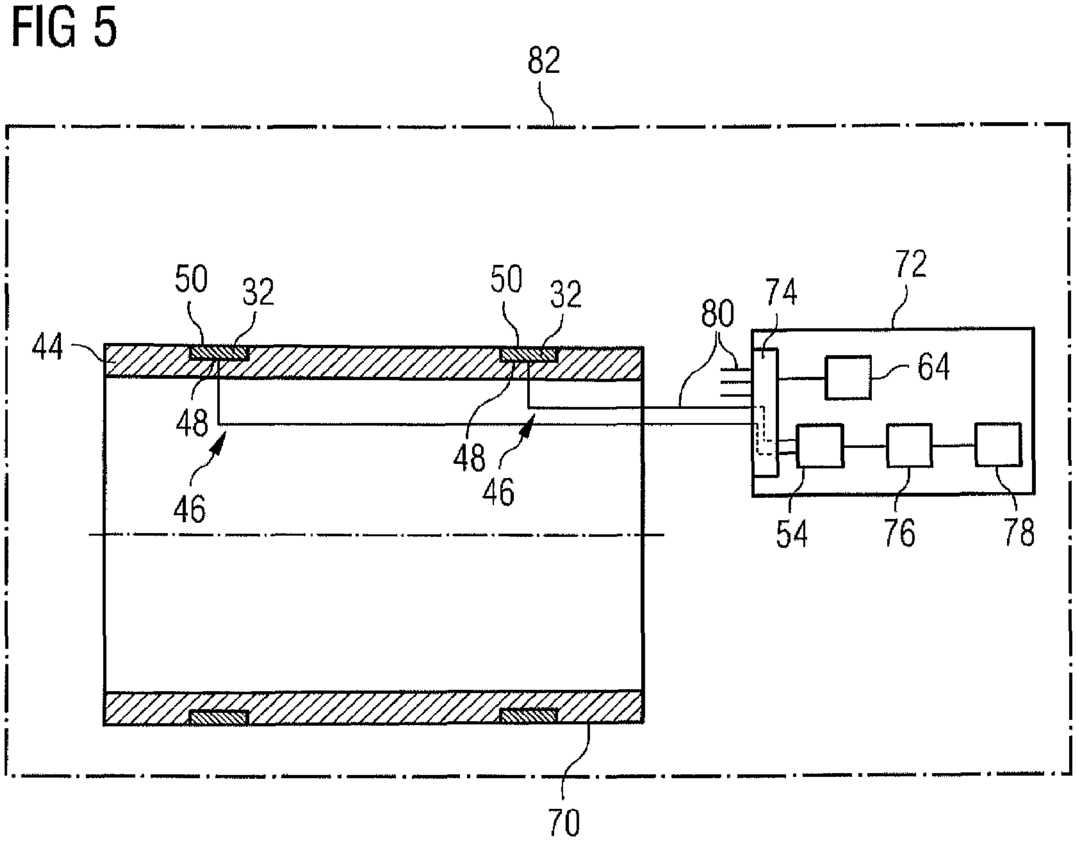
FIG. 5 shows a longitudinal section through another embodiment of a winding mandrel connected to a measuring device.
Figure 6:
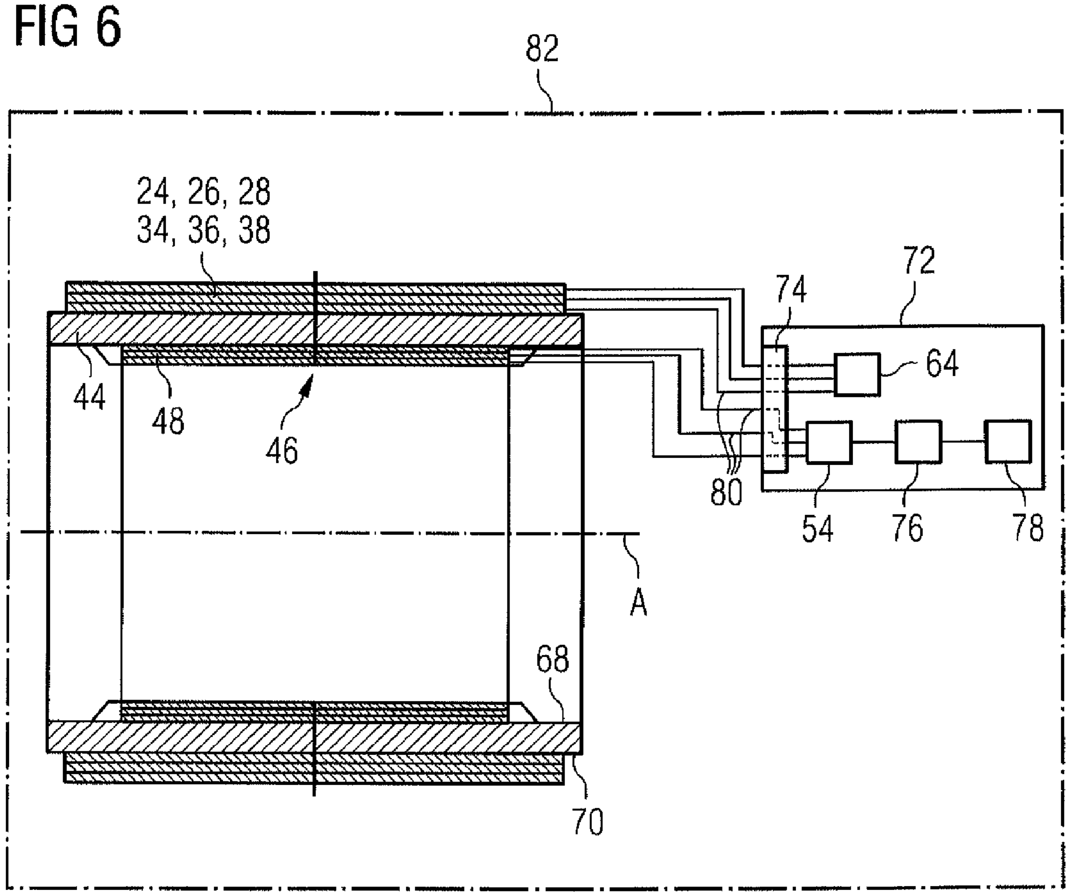
FIG. 6 shows yet another embodiment of a winding mandrel connected to a measuring device.

FIGS. 5 and 6 show how the control coil arrangement 46, as part of one embodiment of a system 82 for producing a gradient coil assembly (not shown in FIG. 5), may be connected to a measuring device 72 for determining coupling inductance values.

The winding mandrel 44, according to the exemplary embodiment in FIG. 5, differs from the winding mandrel 44 according to FIGS. 3 and 4 in that recesses 50 in the form of grooves are introduced into an outer side (e.g., an outer circumferential surface 70) of the cylindrical winding mandrel 44. The control coils 48 of the control coil arrangement 46 are placed into the grooves. The recesses 50 have been cast with a casting compound 32, and the entire winding mandrel 44 is turned again on the outside, so the circumferential surface 70 of the winding mandrel 44 is level for the construction of the primary gradient coil assembly.

The control coil arrangement 46 is connected to a measuring device 72. The measuring device 72 includes a measuring circuit 54, a test signal generator 64, a comparator 76, and an output assembly 78. The measuring circuit 54 of the measuring device 72 is electrically conductively connected, for example, via a switching device 74 to terminals of the control coils 58 of the winding mandrel 44. The construction and the mode of operation of the measuring device 72 are described below with reference to FIG. 7.

FIG. 6 shows a further exemplary embodiment of one embodiment of a winding mandrel 44. The control coil arrangement 46 is applied to the inside 68 of the hollow winding mandrel 44 (e.g., the control coil arrangement 46 protrudes radially inwardly from a surface on the inside 68). The control coil arrangement 46 is connected to the measuring circuit 54 of a measuring device 72, for example.

The primary gradient coil assembly 18, the shim coil assembly 20, and the secondary gradient coil assembly 22 are schematically shown on, for example, the circumferential surface 70 of the winding mandrel 44. Individual coils are electrically conductively connected, for example, via the switching device 74 to the test signal generator 64 of the measuring device 72.

The construction and mode of operation of the measuring device 72 will be described in detail with reference to FIG. 7. Various coupling inductance values L1, L2, L may be determined using the control coil arrangement 46 or control coils 48 with the aid of the measuring device 72. The coupling inductance values L1, L2, L represent an inductive coupling between a gradient coil or shim coil to be checked and the control coil arrangement 46. The coupling inductance values L1, L2, L are therefore a measure of the quality of the coil construction.

The test signal generator 64 of the measuring device 72 includes a regulated oscillator 52 that provides a sinusoidal test signal, for example, with a frequency of 303 Hz and constant amplitude. Outputs of the test signal generator 64 are connected to the switching device 74. The outputs include a plurality of terminals 80, with which the measuring device 72 may be electrically conductively connected to the control coils 48 of the control coil arrangement 46 or the coils of the gradient coil assembly 16 (also the associated shim coil).

The switching device 74 is used for switching between different control coils 48 and/or coils of the gradient coil assembly 16.

Figure 7:
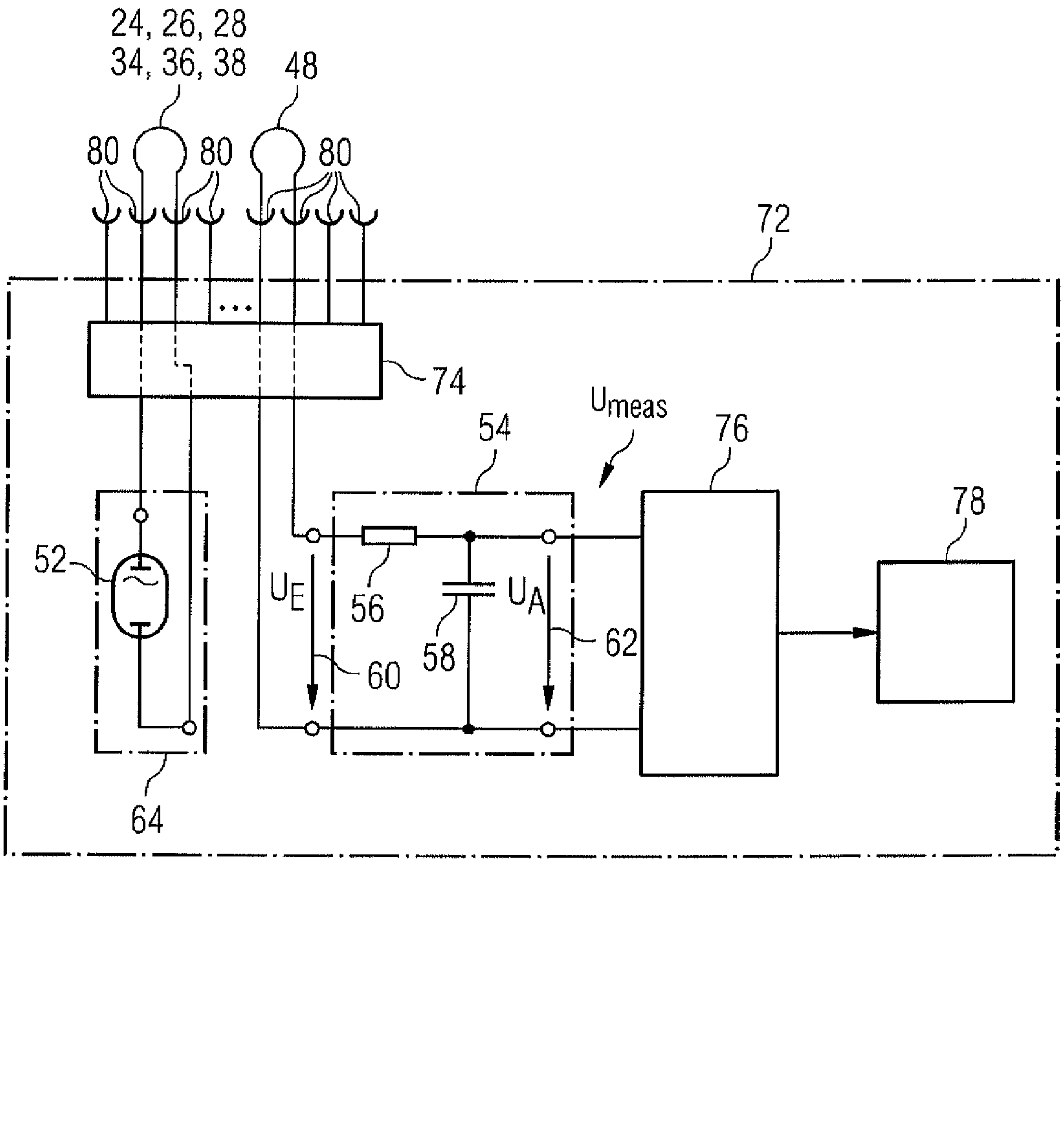
FIG. 7 shows a schematic view of a construction of the measuring device with first exemplary wiring.

In the arrangement shown in FIG. 7, the test signal from test signal generator 64 is fed for an instantaneous measurement via the switching device 74, for example, into one of the gradient coils 24, 26, 28, 34, 36, 38. Owing to the inductive coupling of the relevant gradient coil 24, 26, 28, 34, 36, 38 to the control coils 48 of the control coil arrangement 46, an electrical voltage $U_E$ is induced therein.

Assuming that the test signal has a current characteristic $I=I_0 \cdot \sin(\omega t)$, the induced voltage $U_E$ is obtained according to $$U_E = L \cdot 2\pi \cdot \omega \cdot I_0 \tag{1}$$

In the case of a test signal with an amplitude of $I_0=14.1$ A and a frequency of $\omega=303$ Hz, a ratio $U_E=26843.65 \cdot L$ results between the induced voltage $U_E$ and the coupling inductance value L according to equation (1). This provides that a coupling inductance value L on the order of 1 μH produces a measurable induced voltage $U_E$ of 26.8 mV.

To measure this electrical voltage $U_E$, the respectively chosen control coils 48 are connected via terminals 80 and the switching device 64 to a measuring circuit 54. The measuring circuit 54 includes a low-pass filter that is formed from an ohmic resistor 56 and a capacitor 58. The values for the ohmic resistor 56 and the capacitor 58 are chosen such that the limiting frequency of the low-pass filter of the measuring circuit 54 lies above the frequency of the used test signal of the test signal generator 64 in order to filter out interference signals with a frequency above the test signal frequency. An output voltage $U_A$ proportional to the indicated voltage $U_E$ is applied to the output of the low-pass filter, which represents a coupling inductance value.

If, for example, the test signal generator 64, as assumed above, provides an alternating current signal with an amplitude of $I_0=14.1$ A and a frequency of $\omega=303$ Hz, a resistor 56 of R=10 kΩ and a capacitor 58 of C=0.1 μF may thus be used in the measuring circuit 54. According to the equation $$\frac{U_A}{U_E} = \frac{1}{\sqrt{1+(\omega CR)^2}} \tag{2}$$

this produces, for the ratio of output voltage $U_A$ at the measuring circuit output 62 to the voltage $U_E$ induced in the coil at the measuring circuit input 60, a value of, for example, roughly 0.47. In other words, the following then approximately applies $$U_A = 0.47 \cdot U_E \tag{3}$$

From the combination of equations (1) and (3), it follows that a coupling inductance value L between the coil to be checked and the control coil on the order of 1 μH leads to a measurable voltage $U_A$=12.6 mV at the measuring circuit output 62. In other words, the voltage $U_A$ measured at the measuring circuit output 62 may be converted according to $$L=U_A\cdot 0.0794\ \mu H/mV \quad (4)$$

into a coupling inductance value L if there are no conductive surfaces in the test setup.

The voltage $U_A$ is converted, for example, in a comparator 76 that also compares the coupling inductance value L with a coupling inductance limit value. Various coupling inductance limit values for various pairs of control coils 48 and gradient coils or shim coils, by way of example, may be stored for this purpose in a memory (not shown) in the comparator 76. The result of this comparison is supplied to an output assembly 78 that shows an operator whether the manufacturing tolerances are being maintained or not by way of a visual and/or acoustic display device (not shown).

Instead of loading the gradient coil or shim coil with a test signal and measuring the coupling inductance value at the control coil, the test signal may also be fed into a control coil, and the coupling inductance value may be measured at the gradient coil or shim coil to be checked. The switching device 64 is constructed, for example, such that gradient coils 24, 26, 28, 34, 36, 38, shim coils, or control coils 48 connected to the terminals 80 may be individually connected in any desired manner or be connected in series to the test signal generator 64 or the measuring circuit 54. The switching device 74 also allows individual coils 24, 26, 28, 34, 36, 38 to not be interconnected either (e.g., have free floating potential).

In the exemplary embodiment according to FIG. 7, as an example, a single gradient coil 24, 26, 28, 34, 36, 38 is connected to the test signal generator 64, and a control coil 48 is connected to the measuring circuit 54.

Figure 8:
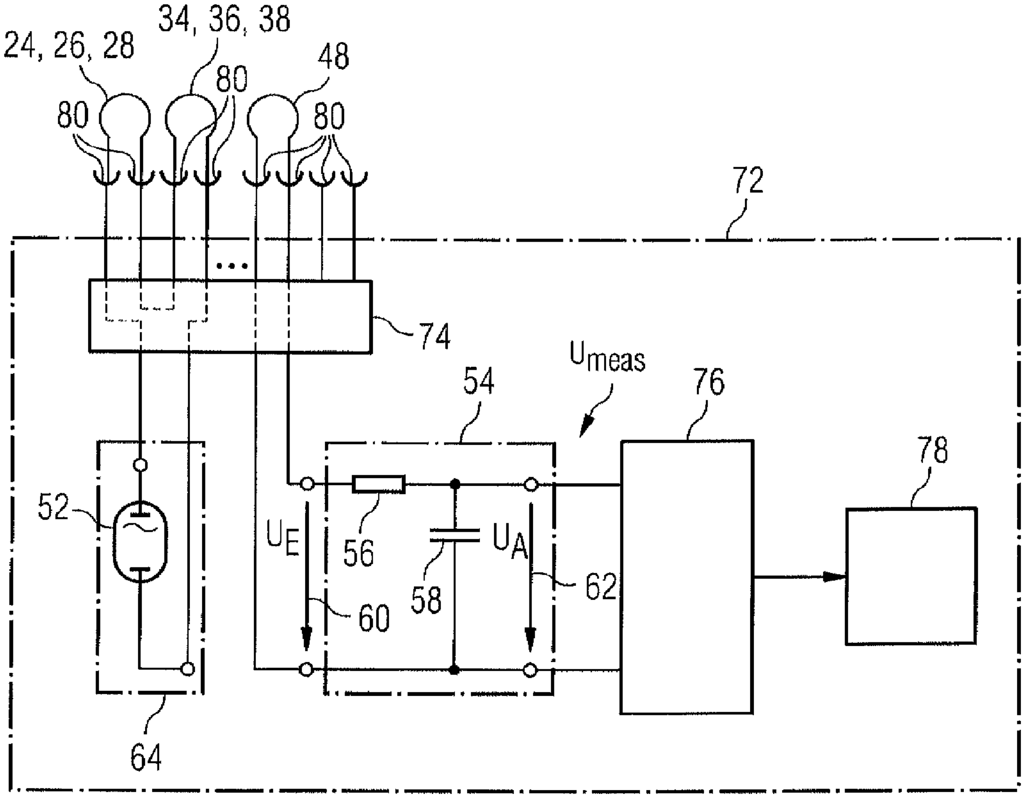
FIG. 8 shows the measuring device according to FIG. 7 with second exemplary wiring.
Figure 9:
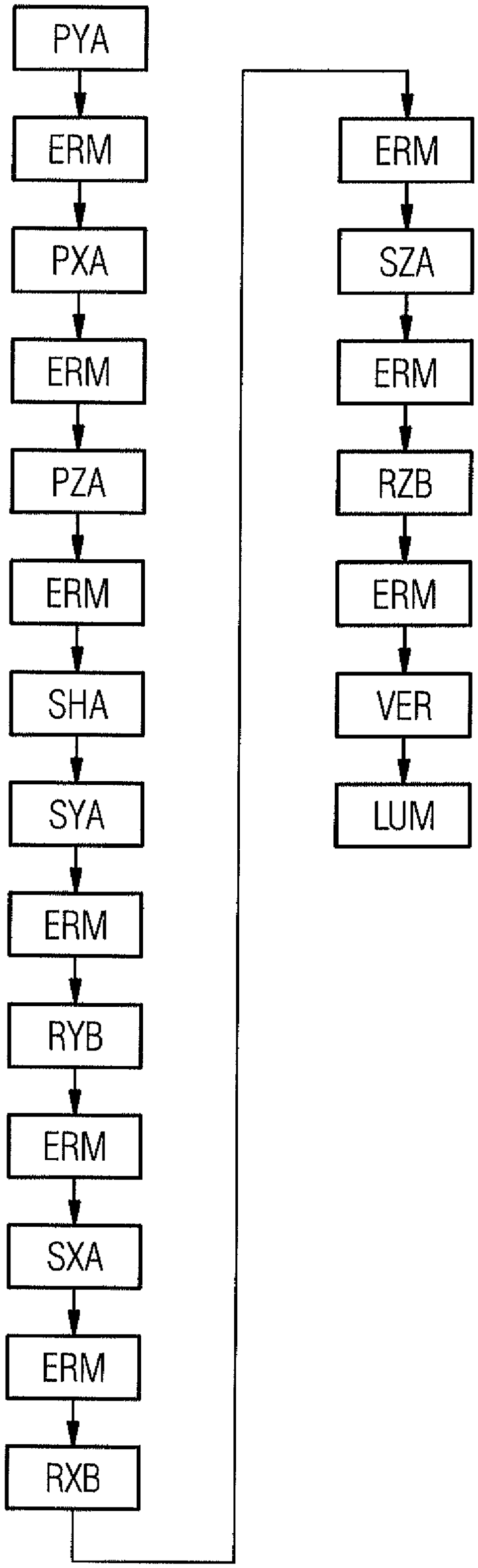
FIG. 9 shows a flow diagram of one embodiment of a method for producing a gradient coil assembly for a magnetic resonance imaging system.

In alternative wiring of the measuring device 72 shown in FIG. 8, two gradient coils 24, 26, 28, 34, 36, 38 are connected in series and connected to the test signal generator 64, so the test signal is given to the gradient coil connected in series to thus determine a total coupling inductance value L of the series connection of the coils. This measuring arrangement according to FIG. 9 is used, by way of example, if the primary gradient coils 24, 26, 28 and at least one of the secondary gradient coils 34, 36, 38 has been applied to the winding mandrel 44. The primary gradient coils 24, 26, 28 and the secondary gradient coils 34, 36, 38 of the same respective axis may be connected in series to each other with an antiparallel direction of winding.

Figure 10:
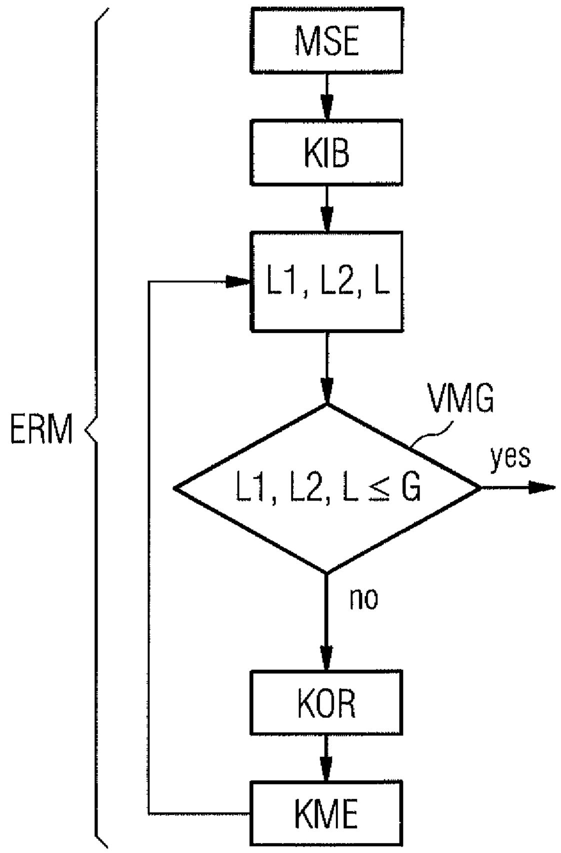
FIG. 10 shows a detailed flow diagram of an exemplary act in the method according to FIG. 9 or 11.

A complete exemplary progression of one embodiment of the method is described with the aid of FIGS. 9 and 10.

A winding mandrel 44, as is shown in FIGS. 3 to 6, having a control coil arrangement 46 and a measuring device 72 according to FIG. 7 is used for the method.

The primary y gradient coil 26 is applied to the winding mandrel 44 in a first act PYA. The arrangement of the primary gradient coil is checked in an intermediate check ERM.

Such an intermediate check ERM is described in more detail with the aid of FIG. 10. Once an operator has established an electrical contact between the newly applied primary y gradient coil 26 and the terminals 80 of the measuring device 72, a test signal is fed into the gradient coil 26 in act MSE, as described above.

In act KIB, a first coupling inductance value L1 is determined by measuring a voltage induced in one of the control coils 48. The first coupling inductance value L1 is compared in act VMG with a coupling inductance limit value G.

In comparison act VMG, if there is an intolerable difference (e.g., branch N), the arrangement (e.g., construction and/or position or orientation) of the primary y gradient coil 26 is corrected in a correction act KOR. A check measurement is made in act KME in accordance with the measurement in act KIB. The result of the check measurement is a first coupling inductance value L1 that is compared with the coupling inductance limit value G.

If the result of the comparison is that the first coupling inductance value L1 lies within the prescribed limits (e.g., branch J), the method is continued according to FIG. 9.

If the control coil arrangement 46 includes a plurality of control coils 48, the above-described process may be repeated for each of the control coils 48 (e.g., if a coupling inductance limit value is maintained before a jump from the intermediate check ERM at branch J, an additional coupling inductance value L1 is checked by another control coil 48, and the arrangement of the coil to be checked is optionally corrected in this respect).

As shown in FIG. 9, the primary x gradient coil 24 is applied in act PXA (see FIG. 10). In intermediate check ERM, following contact of the primary x gradient coil 24 with the measuring device 72, an arrangement check of the primary x gradient coil 24 takes place according to FIG. 10. The primary y gradient coil 26 may be connected so as to be free floating using the switching device 74.

The primary z gradient coil 28 is applied in act PZA, and a subsequent intermediate check ERM takes place according to FIG. 10 for this primary z gradient coil 28. The primary x and y gradient coils 24, 26 may be connected so as to be free floating by way of the switching device 74.

In act SHA, the shim coil assembly 20 with the shim coils 66 is applied. The act SHA may include a plurality of partial acts, in which the individual shim coils 66 are applied. The arrangement of the individual shim coils 66 is checked within the framework of intermediate checks ERM and is optionally being corrected (not shown).

Once construction of the shim coil assembly 20 is complete, the secondary gradient axis assembly 22 is constructed. The secondary y gradient coil 36 is applied in act SYA. In an intermediate check ERM (see FIG. 9), the correct construction and correct position of this secondary y gradient coil 36 is determined by establishing at least one second coupling inductance value L2 between this secondary y gradient coil 36 and a control coil 48 of the control coil arrangement 46 once an operator has established an electrical contact between the secondary y gradient coil 36 and the terminals 80 of the measuring device 72. The primary gradient coils 24, 26, 28 and the shim coils 66 of the shim coil assembly 20 are connected so as to be free floating by way of the switching device 74. If the measuring device 72 or switching device 74 does not have enough terminals 80, the corresponding terminals of the gradient coils or shim coils may be left open.

In act RYB, the switching device 74 of the measuring device 72 interconnects the primary y gradient coil 26 and the secondary y gradient coil 36 to each other to form a series circuit. By contrast, the primary x and z gradient coils 24, 28 and the shim coils 66 of the shim coil assembly 20 are still connected so as to be free floating.

In a check ERM, a test signal flows into the series circuit formed from the primary y gradient coil 26 and the secondary y gradient coil 36. A total coupling inductance value L of the series circuit is determined with the measuring device 72, and a correction is made accordingly. The progression of such an intermediate check ERM is also substantially as described in connection with FIG. 10.

The secondary x gradient coil 34 is applied in act SXA. In a further intermediate check ERM, the secondary x gradient coil 34 is checked, with the primary gradient coils 24, 26, 28, the shim coils 66 and the secondary y gradient coil 36 being connected so as to be free floating.

In act RXB, a series circuit including the primary x gradient coil 24 and the secondary x gradient coil 34 is formed by the switching device 74, and the arrangement of the x gradient coils 24, 34 is checked in a further intermediate check ERM. The primary y and z gradient coils 26, 28, the shim coils 66 and the secondary y gradient coil 36 are connected so as to be free floating.

To complete the secondary gradient axis assembly 22, the secondary z gradient coil 38 is applied in act SZA. The secondary z gradient coil 38 alone is checked in an intermediate check ERM. The primary gradient coils 24, 26, 28, the shim coils 66 and the secondary x and y gradient coils 34, 36 are connected so as to be free floating for this purpose.

The primary z gradient coil 28 and the secondary z gradient coil 38 are connected in series in act RZB by way of the switching device 74. The series circuit, including the primary z gradient coil 28 and the secondary z gradient coil 38, is checked in relation to the total coupling inductance L in the next intermediate check ERM. The primary x and y gradient coils 24, 26, the shim coils 66 and the secondary x and y gradient coils 34, 36 are connected so as to be free floating.

If the secondary z gradient coil 38 is applied as the last gradient coil and all measured coupling inductance values L1, L2, L lie within the predefined limits, the gradient coil assembly 16 is cast with a casting compound 32 in act VER to fix the primary gradient coils 24, 26, 28, the secondary gradient coils 34, 36, 38, and the shim coils 66 of the shim coil assembly 20.

The finished gradient coil assembly 16 is removed from the winding mandrel 44 in act LVM.

Figure 11:
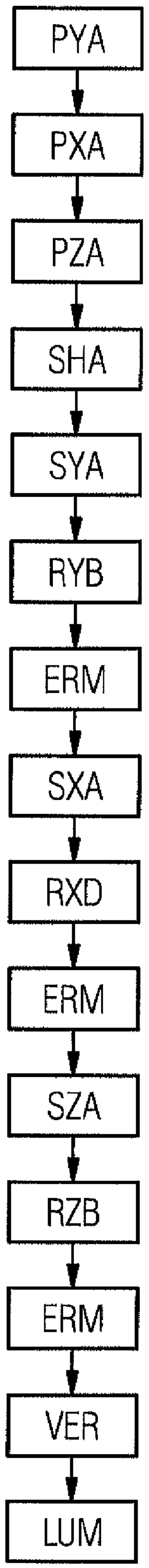
FIG. 11 shows a flow diagram of one embodiment of a method for producing a gradient coil assembly for a magnetic resonance imaging system.

A second exemplary embodiment of the method is described with the aid of FIG. 11. In this method, only the total coupling inductance values L are considered when checking the arrangement of the gradient coil, and determination of first and second coupling inductance values, which represent the coupling of the individual gradient coils, does not occur.

The primary gradient coil assembly 18 is accordingly applied in acts PYA, PXA, PZA. The shim coil assembly 22 with five shim coils 66 is applied in act SHA.

Construction of the secondary gradient coil assembly 22 is begun.

The secondary y gradient coil 36 is applied in act SYA, and in act RYB, a series circuit including primary and secondary y gradient coils 26, 36 is formed. As already described with the aid of FIG. 10, an intermediate check ERM takes place with determination of the total coupling inductance value L. As already described with the aid of FIG. 10, during act ERM, the switching device 74 causes the other coils to be connected so as to be free floating.

The secondary x gradient coil 34 is applied in act SXA, and a series circuit, including the primary and secondary x gradient coils 24, 34, is formed in act RXB. The arrangement of the x gradient coils 24, 34 is checked in a subsequent intermediate check ERM. The other coils are connected so as to be free floating.

To complete the secondary gradient coil assembly 22, the secondary z gradient coil 38 is applied in a act SZA, and a series circuit, including the primary and secondary z gradient coils 28, 38, is formed in act RZB. The arrangement of the z gradient coil 28, 38 is checked in this case, as well as in a subsequent intermediate check ERM, with the other coils connected so as to be free floating.

The gradient coil assembly 16 is cast with a casting compound in act VER, and the finished gradient coil assembly 16 is removed from the winding mandrel 44 in act LVM.

The above-described detailed methods and constructions are exemplary embodiments, and the basic principle may be varied within wide ranges by a person skilled in the art without departing from the field of the invention, as defined by the claims. For example, the present embodiments may be employed not only in the construction of gradient coil units for magnetic resonance imaging systems having a cylindrical patient tunnel but also having patient spaces with a different geometric construction (e.g., U-shaped magnetic resonance imaging systems that are open at a side). As another example, the above-described measurements for all field coils in a gradient system may be performed and evaluated so the measurements are completely automatically controlled. The use of the indirect article "a" or "an" does not rule out the possibility of the relevant features also being present a number of times.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for producing a gradient coil assembly for a magnetic resonance imaging system, the method comprising:

applying a plurality of primary gradient coils and a plurality of secondary gradient coils to a winding mandrel to form the gradient coil assembly, the winding mandrel having an associated control coil arrangement;

determining at least one coupling inductance value during an intermediate check before completion of the gradient coil assembly, the at least one coupling inductance value being determined between the control coil arrangement and at least one primary gradient coil of the plurality of primary gradient coils, at least one secondary gradient coil of the plurality of secondary gradient coils, or the at least one primary gradient coil and the at least one secondary gradient coil; and correcting an arrangement of the at least one primary gradient coil, the at least one secondary gradient coil, or the at least one primary gradient coil and the at least one secondary gradient coil on the winding mandrel as a function of the at least one determined coupling inductance value.

2. The method as claimed in claim 1, wherein a circumferential position, an axial position, or the circumferential position and the axial position of the at least one primary gradient coil, the at least one secondary gradient coil, or the at least one primary gradient coil and the at least one secondary gradient coil is changed as a function of the at least one determined coupling inductance value.

3. The method as claimed in claim 1, wherein applying the plurality of primary gradient coils comprises applying a primary gradient coil of the plurality of primary gradient coils to the winding mandrel to form the gradient coil assembly, wherein determining the at least one coupling inductance value comprises determining at least one first coupling inductance value between the control coil arrangement and the primary gradient coil, and wherein correcting the arrangement of the at least one primary gradient coil comprises correcting the arrangement of the primary gradient coil as a function of the at least one determined first coupling inductance value.

4. The method as claimed in claim 3, wherein applying the plurality of secondary gradient coils comprises applying the at least one secondary gradient coil to the winding mandrel to form the gradient coil assembly, wherein determining the at least one coupling inductance value comprises determining at least one second coupling inductance value between the control coil arrangement and the at least one secondary gradient coil, and wherein correcting the arrangement of the at least one secondary gradient coil comprises correcting the arrangement of the secondary gradient coil as a function of the determined second coupling inductance value.

5. The method as claimed in claim 4, wherein during the determination of a second coupling inductance value of the at least one second coupling inductance value, the plurality of primary gradient coils is connected so as to be free floating.

6. The method as claimed in claim 1, wherein during an intermediate check, a primary gradient coil of the plurality of primary gradient coils and a secondary gradient coil of the plurality of secondary gradient coils are connected in series, wherein the method further comprises determining a total coupling inductance value between the control coil arrangement and the primary gradient coil and the secondary gradient coil connected in series, and wherein correcting the arrangement comprises correcting the arrangement as a function of the total coupling inductance value.

7. The method as claimed in claim 1, further comprising comparing the at least one coupling inductance value with at least one coupling inductance limit value, wherein correcting the arrangement comprises changing the arrangement when a coupling inductance value of the at least one coupling inductance values exceeds the coupling inductance limit value or when the coupling inductance value falls below the coupling inductance limit value.

8. The method as claimed in claim 1, wherein determining the at least one coupling inductance value comprises feeding a test signal into the control coil arrangement or a gradient coil to be checked of the plurality of primary gradient coils and the plurality of secondary gradient coils.

9. The method as claimed in claim 8, wherein the test signal comprises a low-frequency test signal.

10. The method as claimed in claim 9, wherein the low-frequency test signal has a frequency of 20 Hz to 50 Hz.

11. The method as claimed in claim 8, wherein determining the at least one coupling inductance value comprises using a measuring circuit with a low-pass filter having a limiting frequency above the frequency of the test signal.

12. The method as claimed in claim 1, wherein the low-frequency test signal has a frequency of 30 Hz.

* * * * *